(12) United States Patent
Geilen et al.

(10) Patent No.: US 10,155,200 B2
(45) Date of Patent: Dec. 18, 2018

(54) SEPARATION OFF OF A HOMOGENEOUS CATALYST FROM A REACTION MIXTURE WITH THE HELP OF ORGANOPHILIC NANOFILTRATION

(71) Applicant: Evonik Degussa GmbH, Essen (DE)

(72) Inventors: Frank Geilen, Haltern am See (DE); Robert Franke, Marl (DE); Bart Hamers, Horst (NL)

(73) Assignee: EVONIK DEGUSSA GMBH, Essen (DE)

( * ) Notice: Subject to any disclaimer, the term of this patent is extended or adjusted under 35 U.S.C. 154(b) by 225 days.

(21) Appl. No.: 15/040,058

(22) Filed: Feb. 10, 2016

(65) Prior Publication Data

US 2016/0236150 A1    Aug. 18, 2016

(51) Int. Cl.
*B01D 19/00*    (2006.01)
*B01D 61/02*    (2006.01)
(Continued)

(52) U.S. Cl.
CPC ....... *B01D 61/027* (2013.01); *B01D 19/0068* (2013.01); *B01D 61/12* (2013.01);
(Continued)

(58) Field of Classification Search
CPC ...... B01D 61/02; B01D 61/027; B01D 61/04; B01D 61/10; B01D 61/12; B01D 61/36;
(Continued)

(56) References Cited

U.S. PATENT DOCUMENTS 4,863,761 A    9/1989  Puri
5,395,979 A *  3/1995  Deckman ................. B01J 31/24
                                                        568/451
(Continued)

FOREIGN PATENT DOCUMENTS

CN    101272860 B    9/2008
CN    102413908 B    4/2012
(Continued)

OTHER PUBLICATIONS

Priske et al., "Reaction integrated separation of homogeneous catalysts in the hydroformylation of higher olefins by means of organophilic nanofiltration," copyright 2010, Journal of Membrane Science, vol. 360, pp. 77-83 (7 pages).
(Continued)

*Primary Examiner* — Joseph W Drodge
(74) *Attorney, Agent, or Firm* — Nexsen Pruet, PLLC; Philip P. McCann (57) ABSTRACT

The invention deals with the separation of homogeneous catalysts from reaction mixtures with the help of organophilic nanofiltration. It is based on the object of indicating an option as to how organophilic nanofiltration can be used economically for separating off homogeneous catalysts from reaction mixtures if the separation-active material of the membrane satisfying the separation aim is not available in sufficiently large amounts or only at high cost. This object is achieved by taking into consideration a particular membrane performance indicator during the design and/or the execution of the corresponding membrane separation process.

5 Claims, 4 Drawing Sheets

(51) Int. Cl.
  *B01D 71/70* (2006.01)
  *B01D 61/12* (2006.01)
  *B01J 31/40* (2006.01)
  *G06F 17/10* (2006.01)
  *G06F 17/50* (2006.01)

(52) U.S. Cl.
  CPC .......... *B01D 71/70* (2013.01); *B01J 31/4061* (2013.01); *G06F 17/10* (2013.01); *G06F 17/50* (2013.01)

(58) Field of Classification Search
  CPC .. B01D 71/024; B01D 71/027; B01D 71/028; B01D 71/70; B01D 71/76; B01D 2311/02; B01D 2311/04; B01D 2311/08; B01D 2311/14; B01D 2311/16; B01D 2311/25; B01D 2311/2626; B01D 2311/263; B01D 2311/2696; B01D 2325/12; B01D 19/00; B01D 19/0068; B01J 31/4061; B01J 20/10; B01J 20/103; B01J 20/223; B01J 20/28033; B01J 20/283; B01J 20/286; B01J 31/12; B01J 31/122; B01J 31/123; B01J 31/124; B01J 31/128; B01J 31/4015; G06F 17/10; G06F 19/70; G06F 19/701; G06F 19/702; G06F 17/50; G06Q 10/06; G06Q 10/063; G06Q 10/0631; G06Q 50/04; G06Q 99/00
  USPC .............. 210/637, 638, 644, 651; 703/9, 12; 705/400, 413, 500; 95/241, 243, 254; 96/155, 182
  See application file for complete search history.

(56) References Cited

U.S. PATENT DOCUMENTS

| | | | |
|---|---|---|---|
| 5,773,667 A | 6/1998 | Bahrmann et al. | |
| 5,866,235 A * | 2/1999 | Fredrick | B29D 24/001 428/182 |
| 6,184,424 B1 | 2/2001 | Bueschken et al. | |
| 6,239,318 B1 | 5/2001 | Schuler et al. | |
| 6,472,571 B1 * | 10/2002 | Karau | B01D 61/145 568/813 |
| 7,058,587 B1 * | 6/2006 | Horne | G06Q 10/06 705/7.22 |
| 8,226,829 B2 | 7/2012 | Wiese et al. | |
| 9,428,433 B2 | 8/2016 | Fridag et al. | |
| 2002/0049625 A1 * | 4/2002 | Kilambi | G06F 17/50 706/62 |
| 2004/0099603 A1 * | 5/2004 | Livingston | B01D 61/025 210/649 |
| 2006/0237361 A1 | 10/2006 | Dudziak et al. | |
| 2007/0007195 A1 * | 1/2007 | Ebert | B01D 61/027 210/490 |
| 2008/0251456 A1 * | 10/2008 | Wiese | B01D 53/22 210/637 |
| 2009/0032465 A1 | 2/2009 | Baumgarten et al. | |
| 2012/0071316 A1 * | 3/2012 | Voss | B01D 61/027 502/21 |
| 2012/0279922 A1 * | 11/2012 | Haensel | B01D 67/009 210/650 |
| 2014/0343327 A1 | 11/2014 | Hamers et al. | |
| 2015/0018576 A1 | 1/2015 | Baumgarten et al. | |
| 2015/0133695 A1 * | 5/2015 | Brammer | B01J 31/24 568/453 |
| 2015/0299079 A1 | 10/2015 | Fridag et al. | |
| 2015/0336078 A1 | 11/2015 | Hamers et al. | |
| 2015/0336861 A1 | 11/2015 | Geilen et al. | |
| 2016/0002136 A1 | 1/2016 | Lueken et al. | |
| 2016/0082393 A1 | 3/2016 | Priske et al. | |
| 2016/0158703 A1 | 6/2016 | Priske et al. | |

FOREIGN PATENT DOCUMENTS

| | | |
|---|---|---|
| CN | 105579118 A | 5/2016 |
| DE | 10 2008 007080 A1 | 8/2009 |
| DE | 10 2009 047351 A1 | 6/2011 |
| DE | 102012223572 A1 | 6/2014 |
| DE | 10 2013 203117 A1 | 8/2014 |
| DE | 102013208759 A1 | 11/2014 |
| EP | 0 330 076 A2 | 8/1989 |
| EP | 0 781 166 B1 | 8/2000 |
| EP | 0 987 240 B1 | 7/2002 |
| EP | 0 987 241 B1 | 12/2002 |
| EP | 1 931 472 B1 | 1/2009 |
| EP | 1 603 663 B1 | 5/2010 |
| JP | 2007319808 A | 12/2007 |
| WO | WO2006013060 A1 | 2/2006 |
| WO | WO2011067054 A1 | 6/2011 |
| WO | WO2014183952 A1 | 11/2014 |
| WO | WO2015014741 A1 | 2/2015 |
| WO | WO2015058919 A1 | 4/2015 |

OTHER PUBLICATIONS

Marriott et al., "The optimal design of membrane systems," copyright 2003, Chemical Engineering Science, vol. 58, pp. 4991-5004 (14 pages).

* cited by examiner

SEPARATION OFF OF A HOMOGENEOUS CATALYST FROM A REACTION MIXTURE WITH THE HELP OF ORGANOPHILIC NANOFILTRATION

RELATED APPLICATION DATA

The present application hereby claims priority to European Application No. EP 15 155 497 filed Feb. 18, 2015, which is incorporated herein by reference in its entirety.

FIELD

The invention deals with the separation off of homogeneous catalysts from reaction mixtures with the help of organophilic nanofiltration.

BACKGROUND

Membrane technology is a comparatively young technology for separating substance mixtures. Its basic principle consists in adding the substance mixture to be separated to a membrane, the membrane having a different permeability for the individual components present in the mixture. This leads to the components present in the substance mixture to be separated passing through the membrane (permeating) at different rates and accordingly becoming concentrated to differing degrees on both sides of the membrane. A separation criterion is therefore the permeability of the membrane with regard to the substance to be separated off. The driving force is mostly a pressure gradient between both sides of the membrane, the so-called transmembrane pressure $\Delta p$. In addition, other driving forces are also utilized.

Membrane technology utilizes here not only the mechanical sieving effect, which selects components according to differing particle sizes, but also solution and diffusion effects. A membrane thus acts in a considerably more complex manner than a simple mechanical filter and can therefore also separate liquids and/or gases from one another.

In the specific technical configuration, the mixture to be separated is conveyed as feed to the membrane. There, it is separated into a retentate on one side of the membrane and into a permeate on the other side of the membrane. Permeate and retentate are continuously drawn off from the membrane. On account of the separation effect, the components that become enriched in the permeate are those for which the membrane has a high permeability, whereas the substances that collect in the retentate are those for which the membrane is less permeable. Since many membrane processes use membranes which are in principle permeable for all components of the substance mixture—just with different rates of passage—such membrane processes do not separate digitally, but instead there are all of the components of the substance mixture both in the retentate as well as in the permeate, but in a different concentration (mass fraction).

Consequently, in membrane technology for the characterization of the permeability of a membrane, the retention R of the membrane as regards a specific component of the substance mixture is defined as follows:

$$R := 1 - w_P/w_R$$

in which $w_P$ is the mass fraction of the component under consideration in the permeate and $w_R$ is the mass fraction of the component under consideration in the retentate of the membrane. The retention can therefore assume values from 0 to 1 and is therefore preferentially given in %. Looking at a simple two-component system, a retention of 0% thus for example means that the component under consideration permeates just as well as the solvent, meaning that the mass fractions of the component in the retentate are the same as in the permeate. On the other hand, a retention of 100 means that the component under consideration is completely retained.

Besides the retention as regards the component to be separated off, the so-called permeability of the membrane is also decisive for the characterization of its permeability:

$$P := m'/(A*\Delta p)$$

in which m' is the mass stream of the permeate, A is the area of the membrane and $\Delta p$ is the applied transmembrane pressure. The permeability is usually stated in the unit $kg/(h*m^2*bar)$.

Permeability P and retention R are pregiven by the separation-active material of the membrane, and also by the composition of the substance mixture to be separated. These parameters are always relevant when designing a membrane separation process. On account of the substance dependency of these parameters, they are stipulated by the choice of membrane material. Consequently, the selection of separation-active membrane material for the particular separation task is decisive for the overall process design.

The principles of membrane technology reproduced hitherto and below can be consulted in Melin/Rautenbach: Membranverfahren. Grundlagen der Modul-und Anlagenauslegung. [Membrane Processes. Fundamentals of Module and System Design] Springer, Berlin Heidelberg 2004.

Depending on the parameter of the species to be separated off, the separation effects used and the driving force, a distinction is made between different classes of the membranes and/or of the membrane separation processes. The class's ultrafiltration, nanofiltration, gas permeation and reverse osmosis are customary. These concepts are not used uniformly and are not sharply delimited from one another. Whenever the discussion here is of a nanofiltration, what is intended is the separation off of molecules with a molar mass of more than 300 g/mol with the help of a membrane from an at least partially liquid substance mixture. Since such molecules have a diameter in the order of magnitude of 1 nm, the terms nanofiltration or nanofiltration membrane are used.

Depending on whether a predominantly aqueous substance mixture is separated or a predominantly organic substance mixture, the terms used are aqueous nanofiltration or organophilic nanofiltration. Since the resistance of the membrane materials and in particular their swelling behavior in the aqueous or organic medium prove to be very different, this distinction is relevant for the membrane technician.

One field of use in which organophilic nanofiltration can be used is the separation off of catalysts and/or their constituents or degradation products from reaction mixtures which originate from homogeneously catalyzed chemical reactions.

Catalysts serve to increase the rate of chemical reactions without thereby becoming consumed them in the process. In industrial chemistry, catalysts make the implementation of reactions economical or even possible in the first place. Consequently, catalysts are of great value in the chemical industry. Since the catalysts are not consumed, they can be separated off and reused after the reaction catalyzed therewith has concluded. The effort which has to be expended and/or is expended for catalyst separation depends on the value and the type of catalyst.

A distinction is made between two types of catalyst, namely homogeneous and heterogeneous. Homogeneous catalysts are in the same phase of the reaction mixture as the reaction participants, whereas heterogeneous catalysts are in a different phase. The heterogeneous catalysts are mostly solids which can be separated off easily from the liquid or gaseous reaction mixture. If desired, advantageously, this does not even require a sieve or filter since the solid catalyst simply remains in the reactor, while the liquid reaction mixture is drawn off. However, the separation of homogeneous catalysts, which are dissolved in the liquid reaction mixture, is complex. On account of the molecular state of the dissolved homogeneous catalyst, this is not possible with a filter. Consequently, a distillation, extraction or even a membrane separation is required. Since homogeneous catalysts reach particle sizes between 0.5 and 3 nm, a nanofiltration membrane is required for their separation.

One area of industrial chemistry in which organophilic nanofiltration can be used successfully in order to separate off valuable homogeneous catalyst from catalyzed liquid reaction mixtures is the hydroformylation of olefins (alkenes). During this synthesis, also called oxo reaction, olefins with n carbon atoms are reacted with a mixture of hydrogen and carbon monoxide—the so-called synthesis gas—to give aldehydes with n+1 carbon atoms.

The aldehydes are mostly converted to alcohols by hydrogenation, and, on account of their genesis, these are also termed oxo alcohols.

In principle, all olefins are amenable to hydroformylation, but in practice the substrates used in the hydroformylation are usually those olefins having two to 20 carbon atoms. Since alcohols obtainable by hydroformylation and hydrogenation have various possible uses—for instance as plasticizers for PVC, as detergents in washing compositions and as odorants—hydroformylation is practiced on an industrial scale.

The catalysts used in the hydroformylation are, inter alia, organometallic complex compounds which have a metal as central atom which is complexed with different ligands. Often, the ligands used are organophosphorous compounds, nonlimiting examples being organophosphines, organophosphites and organophosphoramidites. Such a catalyst system is dissolved in the liquid reaction mixture of olefin and synthesis gas dissolved therein and is therefore homogeneous. The separation takes place from the drawn-off reaction mixture comprising the formed aldehydes, by-products, unreacted starting materials and even dissolved homogeneous catalyst or constituents or degradation products thereof, thus pure metal, free ligands or degenerated metal and ligands, where degenerated metal can be understood as meaning, for example, multicore metal-carbonyl clusters, which are optionally still ligand-modified. Industrially, catalyst systems are used which have cobalt or rhodium as central atom, the latter often being complexed with organophosphorous ligands such as phosphine, phosphite or phosphoramidite compounds.

In particular, the separation of Rh-based catalyst complexes from homogeneously catalyzed hydroformylation mixtures has proven to be industrially demanding. One reason for this is that Rh is a very expensive noble metal, the loss of which should be avoided if possible. For this reason, the rhodium has to be separated substantially completely from the product stream and recovered. Since the Rh concentration in typical hydroformylation reactions is only 5 to 200 ppm and a typical "world scale" oxo plant achieves an annual output of 200 000 tonnes or more, separation apparatuses have to be used which, on the one hand, permit a large throughput and, on the other hand, safely separate off the Rh present only in small amounts. An additional complicating factor here is that the organophosphorous ligands belonging to the catalyst complex react very sensitively to state changes and rapidly degenerate. Since the decomposition products of the ligands are no longer able to stabilize either the organometallic complexes, or else bond particularly strongly to the metal centers, the sensitive equilibrium at the catalyst complex required for the successful catalytic reaction is disturbed. This leads, in macroscopic terms, to a deactivation of the catalyst. In the best case, a deactivated catalyst can be reactivated only in a costly and inconvenient manner. The catalyst therefore has to be separated off in a particularly gentle manner. A further important development aim is the capital costs of catalyst separation, so to speak of the nanofiltration plant.

Priske, M. et al. report on the possibilities of using membrane technology for processing hydroformylation mixtures: Reaction integrated separation of homogeneous catalysts in the hydroformylation of higher olefins by means of organophilic nanofiltration. Journal of Membrane Science, Volume 360, Issues 1-2, 15 Sep. 2010, pages 77-83; doi:10.1016/j.memsci.2010.05.002.

A more detailed overview of various solvent-based nanofiltration processes (Organic Solvent Nanofiltration, OSN) is given in the literature source: Chem. Soc. Rev., 2008, 37, 365-405.

A great advantage of the membrane separation processes compared to thermal separation processes is the lower energy input; however, in the case of membrane separation processes too, there is the problem of deactivation of the catalyst complex.

This problem has been solved by the process described in EP1931472B1 for the work-up of hydroformylation mixtures, in which a certain carbon monoxide partial vapor pressure is maintained both in the feed, in the permeate and also in the retentate of the membrane. It is thus possible for the first time to use membrane technology effectively in industrial hydroformylation.

A further example in the patent literature which deals with the membrane separation of homogeneous catalysts from hydroformylation mixtures is WO2014/183952A1. There, the retention of a membrane separation device is actively regulated, thus to steady the retentate volume stream and thus to ultimately counteract disturbances in the hydrodynamics of the reactor.

It is a specific disadvantage of membrane separation processes that this still comparatively young technology stands and falls with the availability of the membranes. In particular, the separation-active materials of the membrane which ultimately bring about the separation of the catalyst complexes and therefore critical to satisfying the separation task are still not available in large amounts or at low costs. The separation of large stream volumes, however, requires very large membrane areas and a correspondingly large amount of material and high capital costs. This leads to the technology, that has in the interim become ready industrially, cannot be used everywhere in an economical manner. This problem has hitherto not been solved in terms of process engineering. It relates not only to the hydroformylation, but also other homogeneously catalyzed reactions that are carried out on an industrial scale.

It is therefore an object to indicate an option as to how organophilic nanofiltration can be used for separating off homogeneous catalysts from reaction mixtures in an economical manner if the separation-active material of the membrane satisfying the separation task is not available in sufficiently large amounts or is available only at high cost.

This object is achieved through the consideration of a particular membrane performance indicator during the design and/or execution of the corresponding membrane separation process.

SUMMARY

The membrane performance indicator MPI used according to the invention is defined as follows:

$$MPI:=0.5R^{S/7}(1+P)^{S/(100*R)}-1/(10*P)$$

in which R is the dimensionless retention of the membrane with regard to a metal and P is the permeability of the membrane in kg/(m$^2$*bar*h) and in which S is an assumed or the current market price of the metal in euro/g.

BRIEF DESCRIPTION OF THE FIGURES

The foregoing and other features, aspects, and advantages of the present invention will become better understood with regard to the following description, appended claims, and accompanying drawings where:

DETAILED DESCRIPTION

An economic operation of the membrane separation process is ensured if the membrane performance indicator (MPI) is at least 0.35. Even better, the MPI is at least 0.5 and optimally more than 0.75. The higher the MPI, the better the economic feasibility. The reason for this is that the membrane performance indicator can be used to compare and design membrane processes with regard to their economic feasibility. Although the membrane performance indicator MPI can assume values mathematically greater than 1 and less than 0, its use is sensible only between 0 and 1. This is because no membranes are hitherto known which achieve an MPI greater than 1. The MPI is therefore considered to be limited for values between 0 and 1. Negative values are set as zero, values greater than 1 at 1. Between 0 and 1, the values are rounded to multiples of 0.05, with values from x.00 to x.024 and also those from x.05 to x.074 being rounded down and values from x.025 to x.049 and also those from x.075 to x.099 being rounded up.

The particular nature of the membrane performance indicator MPI defined here consists in the fact that it does not take into consideration the actual costs of the membrane material at all, but is oriented instead to the catalyst costs: this is because the parameter of market price S of the metal refers according to the invention to the metal which is used as central atom in the homogeneously catalytically active organometallic complex compound.

Behind this stands the basic principle to use the market price of the metal as a measure of the separation quality: thus, it may make complete sense economically to conduct the nanofiltration in a considerably poorer manner than is technically possible and in so doing to lose a comparatively large amount of catalyst provided the catalyst is inexpensive. Conversely, it makes no sense to invest a large amount of money in large amounts of expensive membrane material in order to recover a large amount of inexpensive material therewith.

Whether a membrane is now more permeable or more impermeable for the metal to be separated off is determined by the two other parameters of the membrane performance parameter, namely the retention of the membrane with regard to the metal in question and its permeability arising from the process procedure. In this way, found membrane performance parameter links material and process parameter with the externally mandated cost.

In some of the organometallic complexes used as homogeneous catalyst, the metal acting as central atom is not the cost driver, but the organic ligands which are complexed onto the metal atom. In such constellations, it makes sense to relate the market price S not to the metal, but to the actually cost-relevant constituent of the catalyst system, for example the ligand or degradation products thereof. The retention R is then likewise to apply with regard to this cost-relevant constituent of the catalyst system and/or degradation products thereof. In general, instead of the (catalytically active) metal, the process can also be used to separate off another cost-relevant valuable substance. Market price and retention are then correspondingly applied to the valuable substance to be separated off.

The use of the membrane performance parameter leads to surprising results in as much as a permeable membrane is much more preferable over an impermeable membrane. In the past, it was more a case of using the membrane which lets through the least catalyst.

A particular feature of the membrane performance parameter MPI also consists in the fact that it is not a mere cost-related parameter, but can be used directly in technical terms, namely on the one hand as early on as in the planning phase for designing the membrane separation process and, on the other hand, during the running operation of the membrane separation process, more precisely for regulating the nanofiltration used.

On account of the diverse use possibilities of the membrane performance indicator, a large number of processes and devices in the field of the separation of homogeneous catalysts with the help of organophilic nanofiltration is provided by the invention, the common feature of which is the consideration of this membrane performance indicator.

A first option for carrying out the invention consists in using the membrane performance indicator as early on as in the planning phase of the nanofiltration in order to correctly dimension the separation process.

The corresponding embodiment of the invention therefore consists in a method for designing a process for separating off a metal from a reaction mixture by means of a membrane, in which the process is modelled for the separation and in the process the dimensionless retention R of the membrane with regard to the metal (and/or the cost-relevant constituent and/or degradation products thereof) and the permeability P of the membrane is determined in kg/(m2*bar*h), where, assuming a market price S of the metal (and/or the cost-relevant constituent and/or degradation products thereof) in euro/g, a dimensionless membrane performance indicator MPI is determined as follows:

$$MPI:=0.5R^{S/7}(1+P)^{S/(100*R)}-1/(10*P)$$

and where at least one of the parameters retention, permeability and market price is varied and, after variation of the parameter, the membrane performance indicator is again determined until the newly determined membrane performance indicator is at least 0.35.

The procedure thus consists in firstly simulating mathematically the nanofiltration and in so doing roughly presetting the process parameters of the subsequent plant. At least the substance streams through the nanofiltration plant are to be assumed. Moreover, a separation-active membrane material is chosen which in principle satisfies the separation task. For this material, the fundamental parameters of permeability and retention and, if appropriate, their dependencies on the process parameters of transmembrane pressure and temperature are to be determined once only experimentally under relevant process conditions. Each separation-active membrane material has a characteristic ratio of retention and permeability for a substance system to be separated and under standardized framework conditions. However, by varying process parameters such as transmembrane pressure and temperature it is possible to influence the retention and the absolute mass flow through the membrane within a limited parameter window. The influences should if required likewise be determined once only. Now, a market price is assumed for the metal which will constitute the central atom of the catalyst to be separated off. When assuming the market price, it must naturally be estimated how the price of the metal will evolve in the future. For this purpose, for example probabilities based on a Monte-Carlo simulation can be determined from historical data. The MPI can then be calculated according to the formula above. If the calculated MPI is below 0.35 and the pressure and temperature dependencies are known, the operating parameters of temperature and pressure of the nanofiltration can be changed within narrow limits such that retention and mass flow through the membrane are changed. The MPI is then recalculated on the basis of the changed parameters. If it is now above 0.35, an advantageous separation has been found; if it is more below, the operating parameters must be changed further. If a sufficiently high MPI is not obtainable with parameter adaptation, the formulation for the separation-active material of the membrane must be adapted. With the adapted formulation, a membrane sample can then be produced and be measured in the relevant substance system in order to determine the fundamental parameters of retention and permeability under standard processing conditions. It is also possible, through iteration, to further optimize the MPI to values above 0.35, even better to 0.5 or even to more than 0.75. This is because the economic feasibility increases with increasing MPI. The design therefore strives to achieve the highest possible MPI.

During the design, an adaptation of the permeate mass stream m' to the production requirements (plant capacity, adaptation to greater or lesser amounts) is of importance. For permeability pregiven by the membrane material $P:=m'/(A*\Delta p)$, this mass stream can be adapted by adapting the membrane area A or the transmembrane pressure $\Delta p$. If an adaptation is not possible, then a remedy may be provided by choosing a different membrane material with correspondingly higher or lower permeability. The background is that the costs for the membrane material arise directly from the membrane area. If the membrane separation process requires disproportionately large (i.e. expensive) membrane areas to achieve an MPI above 0.35, a termination criterion is satisfied or a different membrane material must be selected. The maximum transmembrane pressure is also pregiven by the membrane since certain membranes break through above a certain transmembrane pressure. A decisive factor here is the support material on which the separation-active material is applied.

The dimensioning of the nanofiltration and the optimization of the MPI is generally carried out with computer implementation. A further embodiment of the invention is therefore a computer program which has instructions which is set up to carry out the design method. The computer program can be programmed as standalone software or be integrated into existing simulation software.

The computer program can be embodied in a computer program product which has a computer program on an electronic signal and/or on a computer-readable medium, for which, after loading the computer program onto a computer, this is set up to carry out the method of the design process.

The result of successful planning of the nanofiltration taking into consideration the MPI is a method for separating and/or retaining a homogeneous catalyst or at least constituents or degradation products thereof from a reaction mixture when the help of organophilic nanofiltration, in which a reaction mixture comprising a liquid organic solvent (generally this is a mixture of feed materials as well as target products and by-products) and, dissolved therein, a homogeneous catalyst and/or constituents and/or degradation products of the homogeneous catalyst is placed onto a membrane and is separated thereon into a retentate and into a permeate, where the homogeneous catalyst and/or its constituents and/or degradation products is enriched in the retentate in such a way that the concentration of the homogeneous catalyst and/or its constituents and/or degradation products in the retentate is greater than in the permeate and in the reaction mixture, and where the homogeneous catalyst is an organometallic complex compound with a metal as central atom, where the separation takes place at a dimensionless membrane performance indicator MPI of greater than 0.35, and where the membrane performance indicator is defined as follows:

$$MPI:=0.5R^{S/7}(1+P)^{S/(100*R)}-1/(10*P)$$

in which R is the dimensionless retention of the membrane with regard to the metal (and/or the cost-relevant constituent of the homogeneous catalyst and/or the degradation products thereof) and P is the permeability of the membrane in kg/(m²*bar*h) and in which S is an assumed or the current market price of the metal (and/or the cost-relevant constituent of the homogeneous catalyst and/or the degradation products thereof) in euro/g.

This embodiment of the invention thus relates to the continuous operation of a homogeneous catalyst separation from a reaction mixture with the help of a nanofiltration which has been designed taking into consideration the MPI and accordingly operates while maintaining an MPI above 0.35 or better. In the best case, this MPI is kept at the current, actual market price. However, it may also be that the MPI is kept only at a previously assumed market price of the catalyst metal (and/or of the cost-relevant constituent of the homogeneous catalyst). In this regard, there is the risk that the actual market price of the metal (and/or of the cost-relevant constituent of the homogeneous catalyst) will evolve too much from the value assumed in planning, as a result of which the MPI may become unfavorable.

Since the membrane performance indicator MPI can be utilized not only during planning, but also while carrying out an organophilic nanofiltration for separating homogeneous catalyst from reaction mixtures, the use of the MPI in the execution and/or the design of such a method is likewise provided by the invention.

A further embodiment of the invention consists in the device for separating off homogeneous catalyst and/or at least constituents and/or degradation products therefrom from a reaction mixture in the course of organophilic nanofiltration, with a membrane which has an input for a feed, an output for the retentate and an output for a permeate, characterized in that the membrane is dimensioned such that a dimensionless membrane performance indicator MPI when the device is operated as intended is at least 0.35, where the membrane performance indicator is defined as follows:

$$MPI:=0.5R^{S/7}(1+P)^{S/(100*R)}-1/(10*P)$$

in which R is the dimensionless retention of the membrane with regard to the metal (and/or the cost-relevant constituent of the homogeneous catalyst and/or the degradation products thereof) and P is the permeability of the membrane in kg/(m$^{2*}$bar*h) and in which S is an assumed or the current market price of the metal (and/or the cost-relevant constituent of the homogeneous catalyst and/or the degradation products thereof) in euro/g, and where the homogeneous catalyst is an organometallic complex compound with the said metal as central atom. The ligands of the organometallic complex compound and/or degradation products thereof are likewise contemplated here as cost-relevant constituent of the catalyst.

In order to be able to operate such a device also in the long-term (i.e. during possibly fluctuating Rh prices) in a state according to the invention, i.e. at an MPI of 0.35 or higher, different developments of the invention are necessary.

One such expanded embodiment of the invention is created such that each time if, for reasons of material ageing or fatigue (the membrane materials are subject to an ageing process which makes it necessary to regularly replace the membranes), a change of all or at least some of the membrane modules is necessary, a current consideration and estimation of the rhodium price (or of the price of the ligand) is carried out. If the current and expected Rh prices for the next operating period differ from the historical values in such a way that the plant would operate outside of the advantageous MPI range, then a different membrane material is used for the membrane modules to be newly inserted, said material having a suitable value pair for retention and permeability, such that the MPI can be brought into the advantageous range again during operation.

Such a device is accordingly intended and set up for carrying out the separation process. The device can be designed such that the MPI is kept static. In order to be able to react to changes of operating parameters or in the metal price, a further development of the device envisages providing it with a regulation which is set up for controlling at least one operating parameter of the device in such a way that the actual value of the membrane performance indicator of the device is regulated to a desired value of the membrane performance indicator set to be greater than or equal to 0.35. During the regulation, it is ensured that the device also operates at advantageous MPIs under changing operating conditions.

In principle, the invention is not limited to certain membrane materials. However, it is found that precisely those membranes which have a separation-active layer made of silicone acrylate are remarkable for particularly high membrane performance indicators. Therefore, particular preference is given to using silicone acrylate membranes for separating homogeneous catalysts from reaction mixtures. In this connection, a silicone acrylate is understood as meaning a compound of the following structure:

where:
a=25-500,
b=1-25,
c=0-20,
R1=independently of one another, identical or different alkyl or aryl radicals having 1 to 30 carbon atoms which optionally carry ether and/or ester and/or epoxy and/or alcohol functions,
R2=independently of one another, identical or different radicals from the group: R1, R3 and R4,
R3=independently of one another, identical or different organic radicals which carry one or more acrylate groups,
R4=identical or different polyether radicals.

A separation-active membrane material of this type is applied to a carrier layer in order to obtain a corresponding membrane (so-called composite membrane). This is performed by dip coating. Such a silicone acrylate membrane is described in more detail in WO2011/067054A1. The particular feature of these membranes is that the silicone acrylates used have not been modified at the chain ends, but laterally. Thus, to be more precise, the membrane material preferably used is laterally modified silicone acrylate. In this connection, it may be advantageous to apply several separation-active layers of different silicone acrylates. Moreover, the properties of the membrane can be adapted to the process requirement by applying two or more different silicone acrylates in different mixing ratios.

Figure 1:
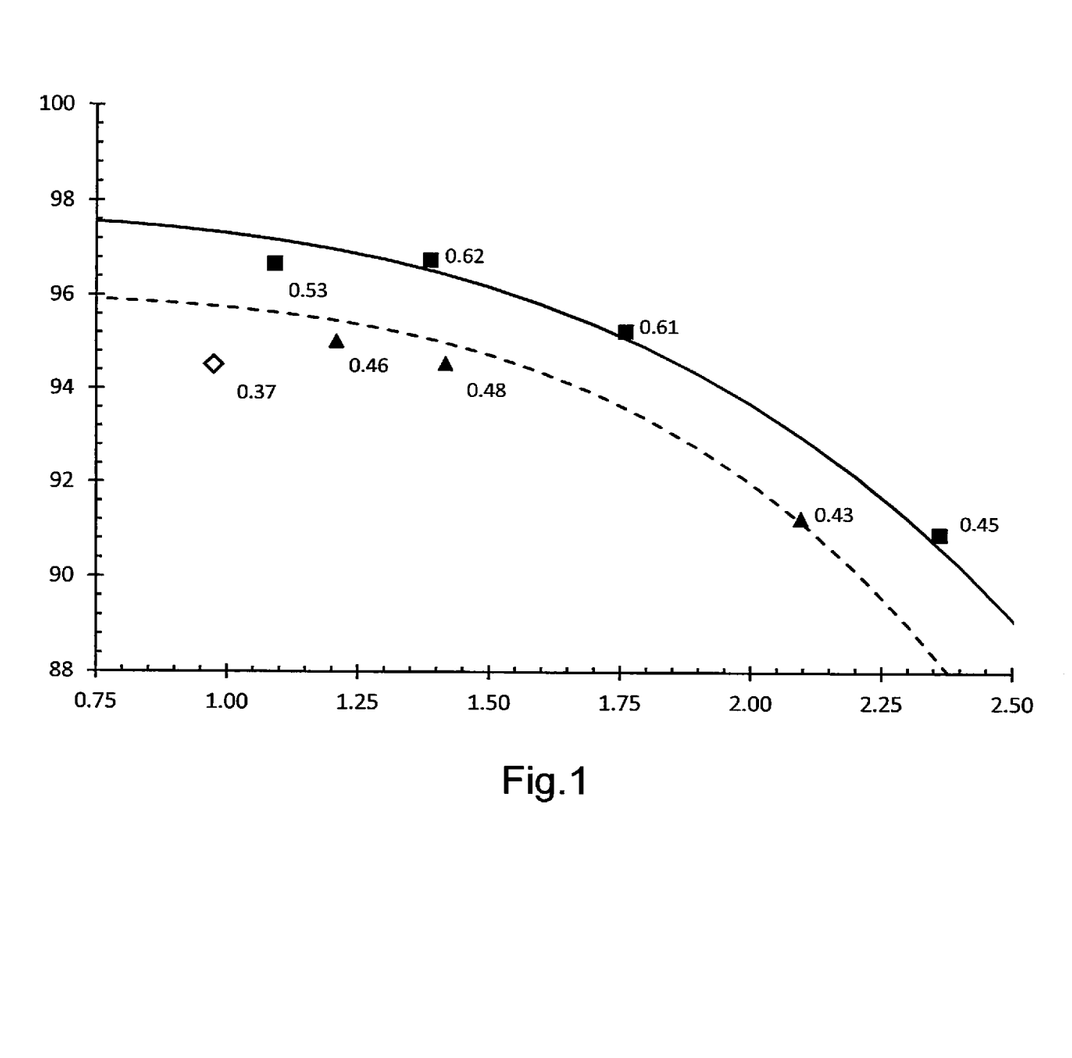
FIG. 1 is a graph showing permeability on the horizontal axis and rhodium retention in [%] on the vertical axis.

The use of the above-described silicone acrylates as pure substances or mixtures for forming the separation-active layer has a particular advantage: the value pair of retention and permeability required for calculating the dimensionless membrane performance indicator MPI can be adjusted over a wide range. FIG. 1 shows this value pair for different membrane types: a commercial comparison membrane with a separation layer of polydimethylsiloxane (PDMS), shown by the symbol diamond ◇, a series of three different silicone acrylate membranes, the separation layer of which consists of one silicone acrylate in each case, shown by the symbol triangle ▲, as well as a series of four silicone acrylate membranes, the separation layer of which consists in each case of a mixture of three silicone acrylates, shown by the symbol square ■.

The permeability in [kg/h m$^2$ h] is plotted on the horizontal axis of the graphs shown in FIG. 1. The rhodium retention in [%] is plotted on the vertical axis of the graphs shown in FIG. 1. The diagram in FIG. 1 also reveals the membrane performance indicators (MPI) calculated in each case. These have all been calculated according to the above formula with a rhodium price of 75 euro/g. The MPI values are entered on the diagram at the measurement points.

It is clear that the silicone acrylate membranes (symbols triangle ▲ and square ■), and in particular those which have mixtures of silicone acrylates as separation-active layer (symbol square ■) are particularly advantageous in the method according to the invention since they achieve high MPI values. As regards the characterization and preparation of the preferably used, laterally modified silicone acrylates, reference is made to WO2011/067054A1.

With regard to this specification, however, it is to be noted that the evaluation of the membranes therein has been made on the basis of model systems such as, for example, polystyrenes of different molecular weights in n-heptane solution. Since the simple model systems generally contain completely different components to the real application systems, it may lead to deviations in the behavior of the membrane. The reason often lies in the fact that the real systems are subject to changes (for example the decomposition of catalyst components) and the liquid mixtures can behave quite differently in chemical and physical terms to the solvents used in the model systems.

For this reason, it has proven expedient for the assessment of a membrane to take into consideration not only, as is customary, the achieved retention of a model component of representative molar mass, but rather the separation performance of the membrane in the real application system. Moreover, during the assessment it should be taken into consideration that the economic separation performance is determined not only by the retention of the membrane for the component to be retained, but also by the average flow of the permeating medium through the membrane. Consequently, according to the invention, an assessment based on the membrane performance indicator (MPI) is undertaken for the catalyst retention in homogeneously catalyzed chemical processes.

The reaction mixture from which the homogeneous catalyst is separated off taking into consideration, in accordance with the invention, the membrane performance parameter can originate from different homogeneously catalyzed chemical reactions. Besides the hydroformylation already described in detail, the reaction mixture can also originate from a hydrocarboxylation, alkoxycarbonylation, methoxycarbonylation, hydrogenation, or hydrocyanation. This is because all of these reactions are usually homogeneously catalyzed with an organometallic complex compound, where the central atoms contemplated are the following metals: cobalt, rhodium, iridium, ruthenium, palladium. If the particular catalyst system catalyzes the reaction, according to the invention, such a homogeneous catalyst system is separated off from the reaction mixture originating from the reaction.

Example 1—Production of Silicone Acrylate Membranes According to the Invention

Silicone acrylate membranes which are able to satisfy the requirements according to the invention can be produced, for example, particularly advantageously with the help of a so-called dip coating process. Such processes are described for example in EP0330076A2. In such processes, a suitable substructure is coated on one side with a solution of one or more silicone acrylates, and optionally auxiliaries such as crosslinking agents or photoinitiators. The solvent is evaporated from the adhering liquid film in a drier. The remaining film made of silicone acrylates and auxiliaries can then be crosslinked by suitable methods, e.g. by means of irradiation with short-wave electromagnetic radiation (e.g. ultraviolet light).

Figure 2:
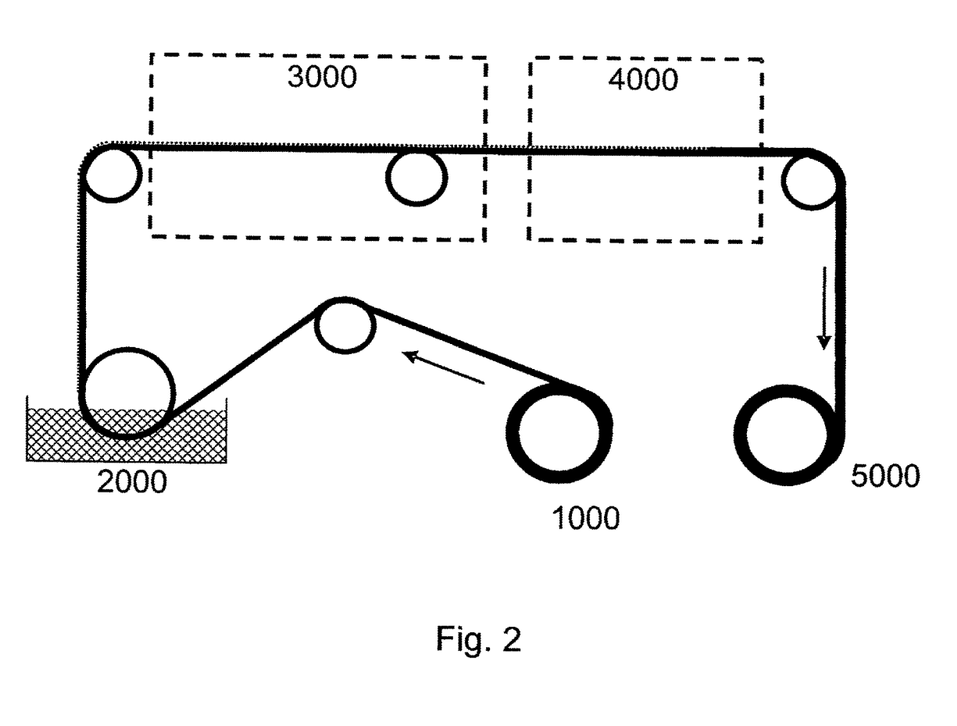
FIG. 2 is a schematic setup of an apparatus for producing silicone acrylate membranes according to the invention.

FIG. 2 shows the schematic experimental setup of a suitable apparatus for producing silicone acrylate membranes according to the invention.

In the present case, an ultrafiltration membrane of the type L6 from GMT Membrantechnik GmbH was used as substructure 1000, but in principle other ultrafiltration membranes (e.g. based on polyimide) are also likewise suitable for producing silicone acrylate membranes.

The substructure was clamped into a coating machine (as shown schematically in FIG. 2) and was coated at rates between 0.5 m/s and 5 m/s by immersion into the polymer bath. The immersion bath 2000 was filled with a solution of the corresponding silicone acrylates and optionally auxiliaries in isopropanol. The coated substructure was dried in a hot-air drier 3000. This must be protected against explosions on account of the vaporizing flammable solvent (approval in accordance with ATEX). The dried-on silicone acrylate layer of the crude membrane was then crosslinked under largely oxygen-free conditions (blanketing with nitrogen 5.0) by irradiation with UV light 4000 and the finished membrane was rolled to give a roll 5000.

For the other experiments, a series of silicone acrylate membranes was produced as described above. Moreover, for the comparison, some membranes with different separation-active layers were used. All of the membranes under consideration are listed in Table 1.

TABLE 1

Example membranes

| Name | Separation-active polymer | Trade name | Components/Composition (%) | (%) | (%) | Conc. % | Rate m/min |
|---|---|---|---|---|---|---|---|
| A | Polydimethylsiloxane | ONF-2 (GMT Membrantechnik) | — | — | — | — | — |
| B | Polyimide | Starmem 122 (Grace/UOP) | — | — | — | — | — |
| C | Polyimide | Starmem 240 (Grace/UOP) | — | — | — | — | — |
| D | Polyimide | Puramem 280 (Evonik Industries AG) | — | — | — | — | — |
| E | Silicone acrylate | — | XP803 2 (100) | — | — | 2.5 | 2.8 |
| F | Silicone acrylate | — | XP803 2 (100) | — | — | 3.0 | 3.5 |
| G | Silicone acrylate | — | XP803 2 (100) | — | — | 1.25 | 4.2 |
| H | Silicone acrylate | — | XP803 2 (100) | — | — | 1.75 | 3.5 |
| I | Silicone acrylate | — | RC702 (100) | — | — | 1.75 | 2.8 |

TABLE 1-continued

Example membranes

| Name | Separation-active polymer | Trade name | Components/Composition (%) | (%) | (%) | Conc. % | Rate m/min |
|---|---|---|---|---|---|---|---|
| J | Silicone acrylate | — | RC702 (100) | — | — | 1.75 | 3.5 |
| K | Silicone acrylate | — | XP803 2 (70) | RC902 (30) | — | 2.5 | 2.2 |
| L | Silicone acrylate | — | XP802 6 (60) | RC902 (30) | XP802 8 (10) | 2.0 | 2.8 |
| M | Silicone acrylate | — | XP802 6 (50) | RC902 (40) | XP802 8 (10) | 2.0 | 4.0 |
| N | Silicone acrylate | — | XP802 6 (50) | RC902 (40) | XP802 8 (10) | 2.0 | 4.3 |
| O | Silicone acrylate | — | XP802 6 (50) | RC902 (40) | XP802 8 (10) | 2.0 | 2.8 |
| P | Silicone acrylate | — | XP802 6 (50) | RC902 (40) | XP802 8 (10) | 2.0 | 2.2 |

Example 2—Determination of the MPI

Figure 3:
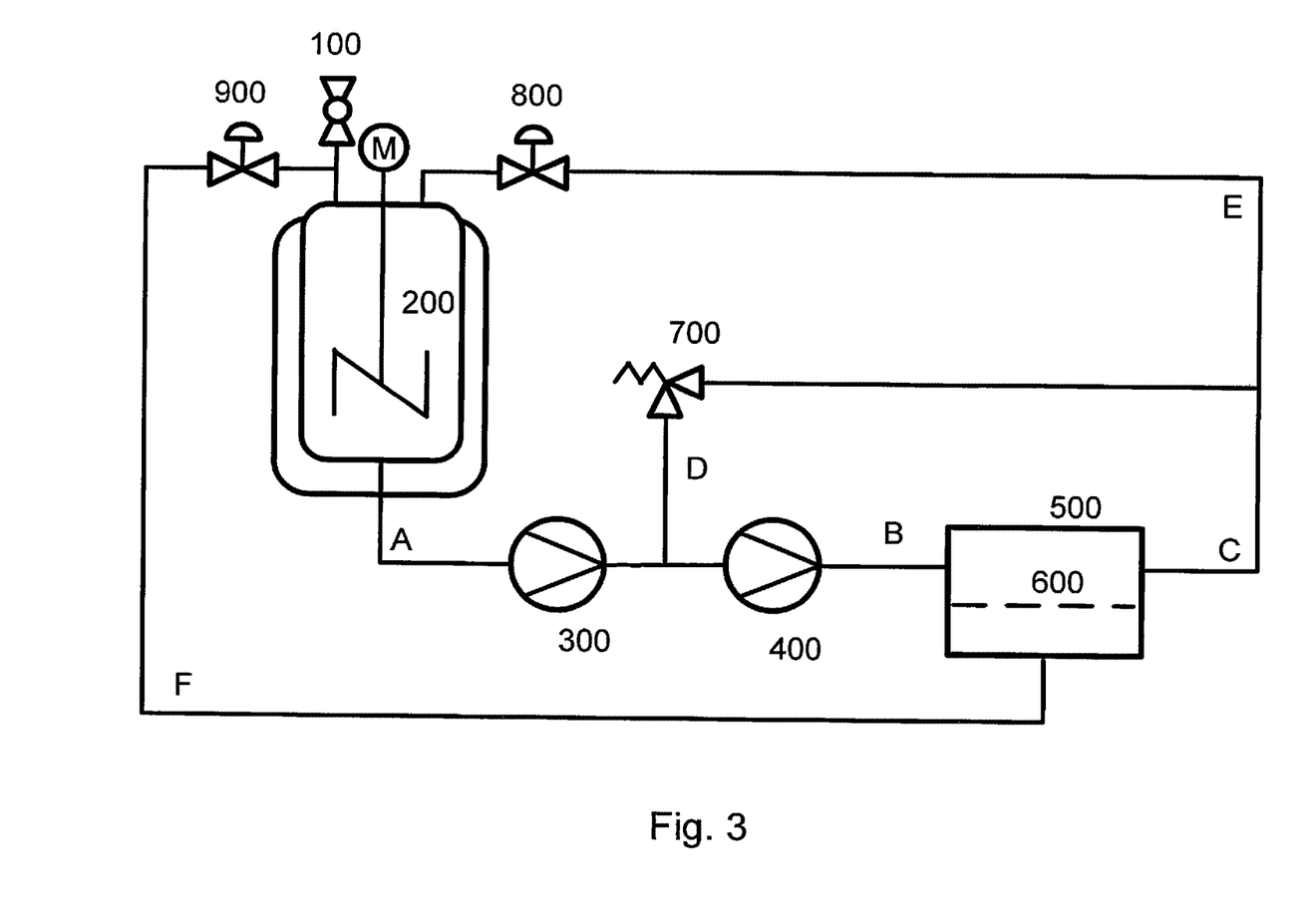
FIG. 3 is a principle apparatus setup.

This example describes the procedure for determining the membrane performance indicator MPI. The membrane to be tested is investigated in a crossflow filtration experiment. The principle apparatus setup for these experiments is shown in FIG. 3.

The experiments are carried out in the circulation apparatus shown. A substance mixture to be investigated, or individual components thereof can be introduced into a heatable stirred-tank container 200 via an entry 100. The mixture is homogenized here throughout the entire experiment time by stirring. If required, an auxiliary gas can be attached to the container which is used for stabilizing the catalyst complexes (not shown in FIG. 3). The mixture A present in the container 100 can then be brought, by means of a pressure increasing pump 300 to the prepressure required for the separation on the retentate side of a membrane 600. The pressure is adjusted via a pressure valve 8. The mixture A is combined after the pump with a return stream D of the membrane 600 and conveyed by a circulation pump 400 to a membrane cell 500. In this cell, the mixture flows crossways to the membrane 600 to be tested. The geometry of the membrane cell presets here the available membrane area. Some of the mixture permeates along a pressure gradient through the membrane 600 and leaves the membrane cell as so-called permeate F. The pressure on the permeate side is adjusted by means of a pressure valve 900 and is always below the pressure on the retentate side of the membrane. The pressure difference between the two pressures is referred to as transmembrane pressure Δp. The permeate F was depleted from the catalyst component to be retained upon passing through the membrane and is returned to the stirred container 200. Some of the mixture B which does not flow through the membrane leaves the membrane cell as catalyst-rich retentate C. Some of the retentate is returned with the help of an overflow valve 700 as return stream D upstream of the circulation pump 400. Thus, a constant and a high through-flow of the membrane cell 500 can be affected, which counteracts a concentration polarization at the membrane. The other part of the retentate E is returned to the container 200.

To determine the permeability P, the mass stream m' of the permeate stream F must be determined; this can be performed by means of a standard commercial mass flow measurement. Furthermore, the pressures on the retentate side and on the permeate side of the membrane are to be measured by means of standard commercial pressure measurement devices. The values give rise to the transmembrane pressure Δp according to $$\Delta p = P_{Retentate\ side} - P_{Permeate\ side}$$

These values and the known membrane area can be used to determine the permeability P:

$$P = m'/(A^*\Delta p)$$

To determine the retention R, the mass concentration (or the mass fraction) of the component to be retained (represented by the central atom in the catalyst complex) in the retentate stream $w_R$ and in the permeate stream $w_P$ must be analyzed. For this, by way of techniques known to the person skilled in the art, samples can be removed from the plant and be passed to a suitable analytical arrangement. For the determination of metal contents in organic media, an analysis by means of inductively coupled plasma mass spectrometry (ICP-MS), for example, is suitable. The metal contents of the two streams thus determined give rise to the retention in accordance with $$R := 1 - w_P/w_R$$

In this connection, it is to be taken into account that retention and permeability are system-specific, thus depend both on the material and the nature of the membrane, as well as also on the substance system to be separated. Since the specific permeability, moreover, has a certain pressure dependency and a sometimes marked temperature dependency, it must be ensured that the permeability of a membrane is to be determined only under the conditions relevant for the subsequent separation process. For this purpose, it has proven to be favorable to measure the membrane at different transmembrane pressures and temperatures. The MPI can then be determined from the resulting value pairs, as stated below, and thus the optimum conditions can be chosen for each membrane (maximum MPI).

For determining the MPI, the market price S of the particular metal is also necessary apart from the retention and the permeability. This can be derived from suitable sources, usually the current and historical prices of precious metals are made available by various precious metal dealers and can be requested via their Internet site, for example from Heraeus under the URL http://heraeus-edelmetallhandel.de/de/marktinformationen/edelmetallpreise/edelmetallpreise.aspx.

The membrane performance indicator MPI can now be calculated from the permeability in kg/m$^2$/bar/h, the dimensionless retention and the market price of the metal in euro/g as follows:

$$MPI:=0.5R^{S/7}(1+P)^{S/(100*R)}-1/(10*P)$$

Different membranes should always be compared here with their optimal MPI (dependent on temperature and transmembrane pressure, see above). Moreover, only MPI values which have been calculated for the same metal price S should be compared with one another.

By way of example, the determination of the MPI is determined below for example membranes A to P which are used for the retention of a homogeneous catalyst in a hydroformylation process. As homogeneous catalyst, an organometallic complex comprising at least one Rh central atom customary for this purpose should be used. A complex species which can be detected in the system for example by means of Operando-IR spectroscopy is [HRh(CO)3L], where L is an organophosphite ligand such as, for example, the standard commercial triarylphosphite Alkanox 240. C8-olefins are hydroformylated to C9-aldehydes.

In the course of the experiment, the stirred container 2 of the plant shown in FIG. 2 was filled with a mixture which corresponds to a reaction mixture originating from a hydroformylation. For this, a mixture, which is called hereinbelow INAL, with the composition:

Isononanal >85% by weight
Isononanol <3% by weight
Di-n-butene <5% by weight
C8-Alkanes <1% by weight
High boilers <10% by weight is admixed with enough (acetylacetonato)dicarbonylrhodium(I) (e.g. CARAC, from Umicore or Heraeus) and tris(2,4-di-tert-butylphenyl)phosphite (e.g. Alkanox 240 from Addivant) such that a rhodium content of 75 to 90 mg/kg of mixture was established. The phosphite ligand Alkanox 240 was added in an amount such that a molar phosphorus-rhodium ratio of 5:1 was established. In order to generate a component corresponding to the catalyst produced industrially, this mixture was stirred for a few hours under a synthesis gas overpressure and elevated temperature before starting the through-flow of the membrane test cell. For the membrane test, the temperature was adjusted to 40° C. and the transmembrane pressure was adjusted to 30 bar. With the help of circulation pump 4 and the overflow 7, a circulation stream of approx. 200 L/h was established on the retentate side. The amount of permeate flowing through the membrane was measured continuously. After establishing a stable operating state, samples were repeatedly drawn from the retentate C and the permeate F and analyzed with regard to the rhodium content by means of ICP-MS. The optimal values for permeability and rhodium retention determined for the different membranes are given in the table below. These values were used to calculate the MPI for four different (arbitrary, but historically accurate) rhodium prices: 25, 50, 75 and 100 euros per gram of rhodium. The results are given in Table 2.

TABLE 2

Specific membrane performance indicators for different membranes

| Name | Rh retention [%] | Permeability [kg/(m2 h bar)] | MPI Rh @ 25 EUROS/g | MPI Rh @ 50 EUROS/g | MPI Rh @ 75 EUROS/g | MPI Rh @ 100 EUROS/g |
|---|---|---|---|---|---|---|
| A | 93.8 | 0.86 | 0.35 | 0.30 | 0.30 | 0.25 |
| B | 98.5 | 0.30 | 0.15 | 0.20 | 0.20 | 0.20 |
| C | 97.4 | 0.40 | 0.25 | 0.25 | 0.25 | 0.25 |
| D | 90.0 | 0.30 | 0.05 | 0.00 | 0.00 | 0.00 |
| E | 74.7 | 2.66 | 0.25 | 0.10 | 0.05 | 0.00 |
| F | 97.3 | 0.50 | 0.30 | 0.30 | 0.30 | 0.30 |
| G | 93.9 | 1.13 | 0.40 | 0.40 | 0.40 | 0.35 |
| H | 94.4 | 0.95 | 0.40 | 0.35 | 0.35 | 0.35 |
| I | 89.6 | 1.49 | 0.35 | 0.30 | 0.25 | 0.20 |
| J | 95.1 | 0.83 | 0.35 | 0.35 | 0.35 | 0.35 |
| K | 91.1 | 1.55 | 0.40 | 0.35 | 0.35 | 0.30 |
| L | 94.0 | 1.32 | 0.45 | 0.45 | 0.45 | 0.45 |
| M | 85.0 | 2.83 | 0.40 | 0.30 | 0.25 | 0.20 |
| N | 89.5 | 1.96 | 0.40 | 0.35 | 0.35 | 0.30 |
| O | 95.2 | 1.08 | 0.40 | 0.45 | 0.45 | 0.45 |
| P | 93.7 | 1.72 | 0.45 | 0.50 | 0.50 | 0.50 |

Example 3

Figure 4:
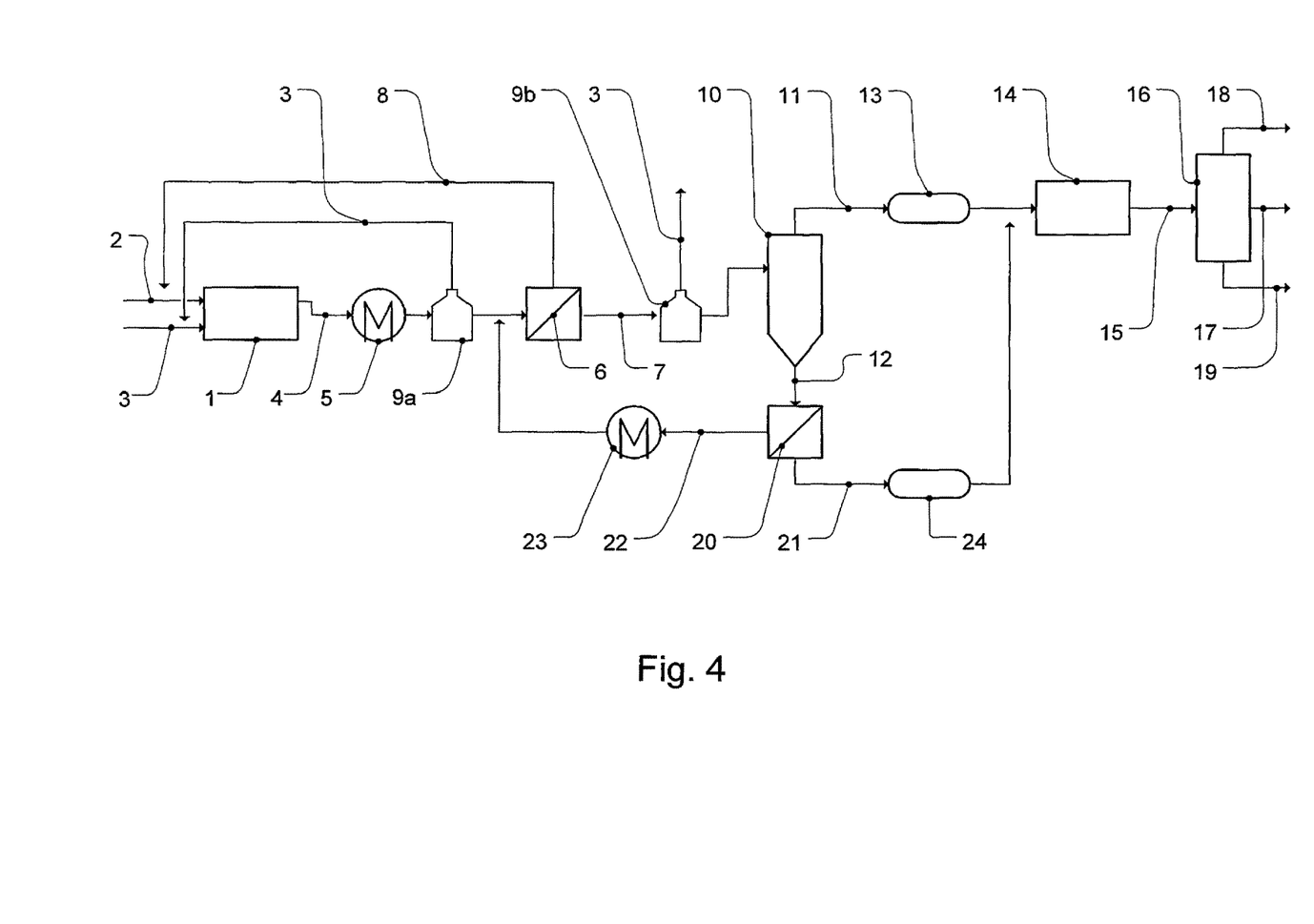
FIG. 4 shows a circuit diagram according to the invention.

This example describes the simulation of a hydroformylation process according to FIG. 4. FIG. 4 shows the circuit diagram of a plant according to the invention with which the process according to the invention can be carried out. As usual, the circuit diagram is simplified in order to improve readability. Self-evident plant components such as valves, pumps and the like are not shown.

The centerpiece of the plant is formed by a hydroformylation reactor 1. The hydroformylation reaction takes place herein. Here, an olefin 2 is reacted with synthesis gas 3—a mixture of carbon monoxide and hydrogen—in the presence of a homogeneously dissolved catalyst to give corresponding aldehydes with one carbon atom more. This reaction is a gas/liquid phase reaction in which the olefin and the reaction products are present in the liquid phase, whereas some of the synthesis gas 3 forms the gas phase and some of the synthesis gas is dissolved in the liquid phase. A homogeneous catalyst complex is likewise dissolved in the liquid phase.

Suitable reactor configurations are in principle those apparatuses which permit a gas-liquid phase reaction. Preference is given to using a bubble column reactor. Bubble column reactors are commonly known in the prior art and are described in detail in Ullmann: Deen, N. G., Mudde, R. F., Kuipers, J. A. M., Zehner, P. and Kraume, M.: Bubble Columns. Ullmann's Encyclopedia of Industrial Chemistry. Published Online: 15 Jan. 2010. DOI: 10.1002/14356007.b04_275.pub2.

However, for reasons of simplicity, an ideally mixed stirred-tank reactor can be assumed for the simulation since the hydroformylation reaction is of secondary importance for the objective under consideration here.

Besides the desired aldehydes, the corresponding alcohols as well as high-boilers are also formed in a subsequent secondary reaction in the hydroformylation. The high boilers include, inter alia, dimers, trimers, aldol products, Tishchenko products, esters and ethers. The high-boiler formation in the reaction is undesired since it leads to yield losses, but is not to be avoided completely in terms of reaction technology. The high boilers therefore have to be excluded from the process according to their rate of formation. The name high boilers therefore touches on the fact that these substances have a higher boiling point than the aldehyde, for which reason the high boilers collect at the bottom of the thermal separation unit and/or the distillation behind the hydrogenation. By contrast, the low boilers include olefins, alkanes and aldehydes which are formed in the hydroformylation or the hydrogenation and/or are already present in the olefin mixture.

A liquid hydroformylation discharge 4 is drawn off from the reactor 1 and comprises, besides the desired aldehyde, also unreacted olefin, synthesis gas dissolved in the liquid, the homogeneously dissolved catalyst system, further low boilers and the high boilers. If an optional solvent is used, this belongs to the low boilers.

In a first heat exchanger 5, the hydroformylation discharge 4 is cooled to a temperature of about 40 to 50° C. In a first degasser 9a, the hydroformylation discharge 4 is decompressed to about 0.5 MPa and the synthesis gas 3, beading out in the process, is returned to the reactor 1. Then, the hydroformylation discharge 4 is placed onto a first membrane separation unit 6. The membrane separation unit 6 is a multistage stripping cascade, as is known from the prior art (e.g. DE102013203117 A1). However, for the functional connection, it suffices to regard the first membrane separation unit 6 as an individual membrane.

The incoming hydroformylation discharge 4 is separated in the first membrane separation unit 6 into a product stream 7 and into a reactor return 8, where the catalyst system present in the hydroformylation discharge 4 is enriched in the reactor return 8. The product stream 7 here constitutes the permeate of the first membrane separation unit 6, whereas the reactor return 8 forms its retentate. Since the first membrane separation unit 6 allows the catalyst system to pass considerably more slowly than the other constituents of the hydroformylation discharge 4, the catalyst system becomes enriched in the reactor return 8. The membrane separation unit 6 is preferably operated such that approximately three quarters of the catalyst system discharged from the hydroformylation reactor 1 is located in the reactor return 8. The retention of the first membrane separation unit is therefore 75% with regard to the catalyst system. For this, the following operating parameters are to be observed:

The membrane temperature is between 20 and 160° C., preferably between 25 and 90° C. and particularly preferably between 30 and 60° C. In the concentrate loops, a 10 to 30 K higher temperature may be advantageous. The transmembrane pressure difference is between 1 and 10 MPa, preferably between 1.5 and 5 MPa. Particularly preferably, the membrane is operated at about 2.5 to 3.5 MPa transmembrane pressure. The preferably used membrane module structure is the spiral coil element.

Preference is given to using membranes which have a separation-active layer made of a material selected from cellulose acetate, cellulose triacetate, cellulose nitrate, regenerated cellulose, polyimides, polyamides, polyether ether ketones, sulphonated polyether ether ketones, aromatic polyamides, polyamidoimides, polybenzimidazoles, polybenzimidazolones, polyacrylonitrile, polyaryl ether sulphones, polyesters, polycarbonates, polytetrafluorethylene, polyvinylidene fluoride, polypropylene, terminally or laterally organomodified siloxane, polydimethylsiloxane, silicones, polyphosphazenes, polyphenyl sulphides, polybenzimidazoles, 6.6 Nylon®, polysulphones, polyanilines, polypropylenes, polyurethanes, acrylonitrile/glycidyl methacrylate (PANGMA), polytrimethylsilylpropynes, polymethylpentynes, polyvinyltrimethylsilane, polyphenylene oxide, alpha-aluminum oxides, gamma-aluminum oxides, titanium oxides, silicon oxides, zirconium oxides, ceramic membranes hydrophobicized with silanes, as described in EP 1 603 663 B1, polymers with intrinsic microporosity (PIM) such as PIM-1 and others, as described e.g. in EP 0 781 166 and in "Membranes" by I. Cabasso, Encyclopedia of Polymer Science and Technology, John Wiley and Sons, New York, 1987. The abovementioned substances may be present, especially in the separation-active layer, optionally in crosslinked form through addition of auxiliaries, or in the form of what are called mixed matrix membranes with fillers, for example carbon nanotubes, metal-organic frameworks or hollow spheres, and particles of inorganic oxides or inorganic fibers, for example ceramic fibers or glass fibers.

Preference is given to using membranes which have, as separation-active layer, a polymer layer made of polydimethylsiloxane or polyimide, or membranes are used, the separation-active layer of which consists of terminally or laterally organomodified siloxane (e.g. silicone acrylates).

As well as the abovementioned materials, the membranes may include further materials. More particularly, the membranes may include support or carrier materials to which the separation-active layer has been applied. In such composite membranes, a support material is still present as well as the actual membrane. A selection of support materials is described in EP 0 781 166, to which reference is explicitly made.

A selection of commercially available solvents for stable membranes are the MPF and Selro series from Koch Membrane Systems, Inc., different types of Solsep BV, the Starmem™ series from Grace/UOP, the DuraMem™ and PuraMem™ series from Evonik Industries AG, the NanoPro series from AMS Technologies, the HITK-T1 from IKTS, and also oNF-1, oNF-2 and NC-1 from GMT Membrantechnik GmbH and the Inopor® nano products from Inopor GmbH.

The retentate of the first membrane separation unit 6—referred to here as reactor return 8 or else as primary recyclate—comprises, besides the high rhodium concentration, the other substances of the hydroformylation discharge, namely aldehyde, olefin, dissolved synthesis gas, further low boilers and higher boilers. The reactor return 8 is returned to the hydroformylation reactor 1. The reactor return does not need here—as shown simplified in the drawing—to be fed into the reactor 1 together with the fresh olefin 2 and the fresh synthesis gas 3. It is entirely plausible to feed these three streams into the hydroformylation reactor 1 separately at different points.

In order to prevent the catalyst system losing its activity in the first membrane separation unit 6, this membrane separation step is carried out while retaining a minimum CO partial vapor pressure. As explained in EP1931472B1, this should be at least 100 kPa. For this reason, the decompression in degasser 9a does not take place completely, but only to 0.5 MPa. This is because the dissolved synthesis gas should only be removed behind the membrane. For this, the product stream 7 is decompressed to atmospheric pressure in a second degasser 9b. The synthesis gas remaining in the permeate of the first membrane separation unit escapes completely here and is eliminated from the plant.

The degassed product stream 7 is then transferred to a thermal separation unit 10. In the simplest case, this is a distillation column, but is preferably a combination of a thin-layer evaporator and a falling-film evaporator or a combination of two or three falling-film evaporators.

In the thermal separation unit 10, the product stream 7 is evaporated under the action of heat. For this, a bottom temperature of 90° C. is adjusted on the falling-film evaporator; the bottom temperature on the thin-layer evaporator is 100° C. The evaporation is assisted by an applied vacuum of in each case about 30 hPa. In this way, more than 90% of the mass introduced with the product stream 7 into the thermal separation unit 10 evaporates. This vaporous mass forms the top product 11 of the thermal separation unit. Since the introduced components have different boiling points, not only does a purely quantitative separation of the product stream 7 take place as a result of the evaporation, but also a qualitative one: on account of the lower boiling point, aldehyde, alcohol and the other low boilers are preferably enriched in the top product 11. The nonevaporated components form a liquid bottom product 12, which essentially consists of high boilers, aldehyde and catalyst system, where aldehyde and high boilers constitute approximately the same weight fraction. The operating conditions of the thermal separation unit are selected such that preferably 95% of the aldehydes introduced with the product stream 7 are in the top product 11. At most 5% of the aldehydes introduced with the product stream 7 remain in the bottom 12.

The large mass stream comprising the products of value and drawn off as top product 11 is then conveyed through a first adsorber 13. The function of the adsorber 13 consists in capturing residual amounts of catalyst, in particular precious metal, which has been entrained in droplets with the vapor. This is performed by using a conventional adsorbent such as activated carbon, silicates or aluminum oxides, which are used as fixed bed. The adsorption is carried out at a temperature between 30 and 140° C. and space velocities of from 0.01 to 5 l/h.

The top product 11 now purified completely of catalyst loading is now fed to a hydrogenation 14. The hydrogenation takes place in two serially connected hydrogenation reactors. The first reactor is operated in loop mode, the second in a straight path. The hydrogenation takes place in the liquid phase in a temperature range from 120 to 220° C., preferably at a temperature of 160° C. and indeed adiabatically. The pressure is 1.5 to 30 MPa. The hydrogenation takes place in a heterogeneous fixed-bed catalyst such as, for example, copper, cobalt, copper/nickel, copper/chromium, copper/chromium/nickel, zinc/chromium, nickel/molybdenum catalysts which can optionally also have other elements. Details relating to the design of a suitable hydrogenation are described in EP0987240B1 and EP0987241B1, and also in DE102008007080A1.

The hydrogenation mixture 15 drawn off from the hydrogenation 14 now comprises essentially alcohol, alkanes (from unreacted olefins), as well as hydrogenated low boilers and high boilers. The hydrogenation mixture 15 is then passed to a thermal work-up 16 and divided therein into an alcohol-rich fraction 17, a low boiler fraction 18 and a high boiler fraction 19. The alcohol-rich fraction 17 here constitutes the actual product value of the process according to the invention. The low boilers 18 and high boilers 19 are by-products which can be marketed for subordinate purposes. The thermal work-up 16 of the three fractions 17, 18 and 19 from the hydrogenation mixture 15 will be explained in more detail by reference to FIG. 3.

If the conversion of the alkenes in the hydroformylation is not complete, a relatively large amount of unreacted alkenes will be found in the top product 11 of the thermal separation unit 10. In order that these are not lost in the hydrogenation 14, the hydrogenation can also be arranged behind the thermal work-up, and indeed once for the alcohol-rich fraction 17 (which in this case is more aldehyde-rich) and once for the high boiler fraction 19. The low boiler fraction 18 then comprises the unreacted alkenes and can be returned to the hydroformylation reactor 1 (not shown in this figure). The top product 11 is thus not fed completely to the hydrogenation, but only partly during an alkene recycle; the alkenes are separated off beforehand and recycled.

As already mentioned, essentially the high boilers, smaller amounts of aldehyde and catalyst are found in the bottom product 12 of the thermal separation unit 10. The mass stream of the bottom product 12 is considerably smaller than that of the top product. If the product stream is 30 tonnes per hour and if the proviso is observed that 90% of the introduced mass leaves the thermal separation unit 10 overhead, the mass stream of the bottom product 12 is merely 3 t per hour, thus 1/9 of the top product.

The bottom product 12 is now placed onto a second membrane separation unit 20. There, the bottom product 12 is separated into a permeate 21 and a retentate 22, where the catalyst system is enriched in the retentate 22 since the second membrane separation unit 20 preferentially retains the catalyst system. Thanks to the small mass stream which the second membrane separation unit 20 has to separate compared to the first membrane separation unit 6, it is possible to retain the catalyst present in the bottom product 12 virtually completely and to enrich it in the retentate 22. This is possible particularly if a membrane material is selected which is permeable to a particular degree for high boilers and consequently enriches the high boilers in the permeate 21. Retentate 22 then essentially consists of aldehyde and catalyst.

The separation in the second membrane separation unit 20 takes place at a temperature between 20 and 160° C., preferably between 25 and 90° C. and particularly preferably between 30 and 60° C. The transmembrane pressure difference is between 1 and 10 MPa, preferably between 1.5 and 5 MPa. The membrane is particularly preferably operated at about 2.5 to 3.5 MPa transmembrane pressure. The preferably used membrane module structure is the spiral coil element.

The first and the second membrane unit can operate with the same or different membrane materials. For the examples under consideration, however, both membrane units were always designed with the same membrane material.

Very particular preference is given to using membranes made of terminally or laterally organomodified siloxanes.

The second membrane separation unit 20 is designed as a multistage intensification cascade. For an understanding of the function of the second membrane separation unit 20, the assumption that it is a simple membrane suffices.

The retentate 22 drawn off from the second membrane separation unit 20 is cooled in a heat exchanger 23 to about 40 to 50° C. and then mixed with the likewise cooled hydroformylation discharge 4 and returned to the first membrane separation unit 6. The returning of the secondary recyclate (retentate 22) to the first membrane separation unit 6 behind the hydroformylation reactor 1 opens up the decisive advantage that regulation-related interferences between the regulation of the second membrane separation unit 20 and the hydroformylation reactor 1 are reduced. It also prevents aldehyde being unnecessarily returned to the reaction with the retentate 22 and the yield thereof being reduced. The catalyst constituents returned via the secondary return 22 are for the most part scooped off again from the first membrane separation unit 6 and returned to the reactor 1 via the primary reactor return 8.

The permeate 21 of the second membrane separation unit 20, consisting for the most part of high boilers and residual aldehyde, is conveyed through a second adsorber 24 in order to take up and safeguard residual amounts of catalyst. To separate off precious catalyst metals from the liquid permeate 21, the adsorption is carried out at a temperature of 30 to 140° C. and space velocities of 0.01 to 5 l/h. Preferably, the adsorbent is used in the form of a fixed bed.

Adsorbents that can be used are, in particular, activated carbon surface-rich polysilicic acids such as silica gels (silica xerogels), highly dispersed silica, surface-rich aluminum oxides and aluminum oxide hydrates as well as spent or new (hydrogenation) catalysts.

Particularly advantageous adsorbents have proven to be chemically modified silica materials, as disclosed in WO 2006013060 A1. Adsorbents of this type are available under the article name Mercaptoalkyl-modified Silica, type Rh H3, Batch No. 09-S26-001 from PhosphonicS Ltd, 114 Milton Park, Abingdon, OXON, OX14 4SA, United Kingdom.

The permeate 21, now completely purified from catalyst residues by adsorption, is now fed to the hydrogenation 14 together with the likewise adsorptively purified top product 11. Alternatively, it would be conceivable to pass top product 11 and permeate 21 to separate hydrogenation reactions instead of to a common hydrogenation 14 (not shown).

There are various influential factors of the economic feasibility of the process. Firstly, the rhodium feed factor (corresponds to the loss of Rh) should be as low as possible, and secondly the capital costs, which depend inter alia on the membrane area required, should not be too high.

For the variants under consideration, the total volume of the reactor is 67 m$^3$. Aspects such as heat transmission or geometric configuration of the reactor have not been taken into consideration for the modelling. The feed of dibutene is 20 t/h, meaning that for 8500 operating hours per year a yield of 93% to the product nonanal is required in order to achieve the worldwide production scale of 200 kt/a. A uniform membrane with a defined retention-permeability value pair is used in all membrane stages. The membrane values (retention and permeability) used for the simulated cases correspond to the values summarized in Table 2.

The simulation produces two meaningful values which are shown in Table 3 below: This is firstly the total membrane area resulting from the membrane permeability which is required in order to deduce the required amount of permeate from the membrane plants. The total area of the nanofiltration units 6 and 20 is given. Secondly, this is the mass fraction of rhodium present in the permeate 21 of the second nanofiltration stage. The permeate stream 21 is 365 kg/h and was kept constant for all of the membranes under consideration. For this purpose, the membrane area was varied according to the permeabilities.

Using these values, it can be comprehended through simple consideration which membrane would be the preferred one under the stated conditions. In order to illustrate this, the following assumptions are made:

The rhodium which leaves the plant with the permeate stream 21 is passed through the adsorber 24. 81% of the rhodium which is passed to the adsorber can be recovered. Thus, only 19% of the rhodium present in the permeate 21 has to be purchased later at market prices. The market prices for rhodium are as assumed in Example 1 in four cases at 25, 50, 75 and 100 euro/g.

For the membrane, a price of 600 euros per square meter is estimated.

The capital costs for the membrane installation are initially not taken into consideration.

Under these assumptions, a simple consideration of the economic feasibility can be carried out. For this, the values are calculated from Table 3 with the aforementioned assumptions relating to the production cost fraction in euros per metric ton of product, which depends directly on the retention and permeability properties of the membrane.

TABLE 3

Membrane areas and Rh concentrations in the permeate

| Name | Membrane area [m$^2$] | w(Rh)$_{permeate}$ [mg/kg] | Rh @ 25 EUR/g | Rh @ 50 EUR/g | Rh @ 75 EUR/g | Rh @ 100 EUR/g |
|---|---|---|---|---|---|---|
| | | | Production costs proportion [euro/g product] | | | |
| A | 3139.2 | 7.1 | 5 | 6 | 8 | 10 |
| B | 9020.0 | 0.4 | 14 | 14 | 14 | 14 |
| C | 6765.0 | 1.3 | 10 | 10 | 10 | 11 |
| D | 9020.0 | 18.4 | 15 | 17 | 18 | 19 |
| E | 1018.8 | 110.3 | 10 | 17 | 26 | 34 |
| F | 5466.7 | 1.4 | 8 | 8 | 9 | 9 |
| G | 2401.1 | 7.0 | 4 | 5 | 5 | 6 |
| H | 2857.4 | 5.9 | 4 | 5 | 6 | 6 |
| I | 1819.8 | 20.0 | 5 | 6 | 9 | 12 |
| J | 3276.0 | 4.5 | 5 | 6 | 6 | 6 |
| K | 1745.8 | 14.6 | 4 | 5 | 6 | 7 |
| L | 2048.4 | 6.7 | 4 | 4 | 5 | 5 |
| M | 956.2 | 40.9 | 4 | 7 | 10 | 13 |
| N | 1380.6 | 20.2 | 4 | 5 | 7 | 8 |
| O | 2505.6 | 4.2 | 4 | 4 | 5 | 5 |
| P | 1573.3 | 7.4 | 3 | 3 | 4 | 5 |

Example 4—Determination of the MPI for an Ru-Catalyzed Hydrogenation

Example 4 describes the procedure for determining the membrane performance indicator MPI. The membrane to be tested is investigated in a crossflow filtration experiment. Experimental setup and principle procedure correspond to the description in Example 2. Suitable ruthenium-Catalyzed processes are, for example, the hydroformylation of olefins or else the hydrogenation of carbonyl and/or carboxyl compounds and their derivatives (ketones, aldehydes, carboxylic acids, carboxylic esters, lactones, amides, lactams).

In Example 4, selected membranes from Example 1 are used in a reaction system comprising isononanol (product of value), isononanal (intermediate product), high-boiling by-products, and a homogeneous hydrogenation catalyst. The hydrogenation catalyst can be in the form of a defined complex, but is more likely a mixture of different organometallic complex species, and degradation products thereof. The catalyst is formed either in situ from an Ru metal precursor (e.g. ruthenium(III) acetylacetonate [Ru(acac)$_3$]) and a phosphine ligand (e.g. triphos=1,1,1-tris((diphenylphosphino)methyl)ethane, tribuphos=1,1,1-tris((di-ortho(tert-butyl)phenylphosphino)methyl)ethane) or from a preformed Ru-phosphine complex (e.g. [(Triphos)Ru(TMM)], where TMM=trimethylenemethane). The hydrogenation was carried out in the gassed stirred-tank reactor of the test stand from FIG. 3. The reaction temperature was 140° C. and a hydrogen pressure of 50 bar was established. The ruthenium concentration was adjusted to 75-100 milligrams of ruthenium per kilogram of product mixture, the ligand triphos was used in a slight excess (1.1 mol/mol Ru). The product mixture with the aforementioned composition left the reactor and was worked up in the membrane separation unit. Permeability and Ru retention of the membrane were determined by means of measurements and sampling from the various streams (cf. Example 2). The values are given in Table 4 and were converted to an MPI in accordance with the described formula. For this, the market prices for ruthenium given in the table were used.

TABLE 4

Permeability and Ru retention of the membranes

| | | | MPI | | |
|---|---|---|---|---|---|
| Name | Ru retention [%] | Permeability [kg/(m2 h bar)] | Ru @ 1 EUR/g | Ru @ 5 EUR/g | Ru @ 20 EUR/g |
| A | 94.0 | 0.28 | 0.32 | 0.31 | 0.26 |
| B | 99.0 | 0.11 | 0.05 | 0.04 | 0.04 |
| D | 91.2 | 0.10 | 0.00 | 0.00 | 0.00 |
| F | 97.3 | 0.16 | 0.19 | 0.18 | 0.17 |
| G | 93.8 | 0.37 | 0.36 | 0.35 | 0.31 |
| H | 94.1 | 0.31 | 0.33 | 0.32 | 0.28 |
| L | 94.0 | 0.44 | 0.38 | 0.37 | 0.34 |
| M | 87.6 | 0.94 | 0.44 | 0.42 | 0.34 |

TABLE 4-continued

Permeability and Ru retention of the membranes

| | | | MPI | | |
|---|---|---|---|---|---|
| Name | Ru retention [%] | Permeability [kg/(m2 h bar)] | Ru @ 1 EUR/g | Ru @ 5 EUR/g | Ru @ 20 EUR/g |
| N | 92.3 | 0.63 | 0.42 | 0.41 | 0.36 |
| P | 93.2 | 0.56 | 0.41 | 0.40 | 0.36 |

Example 5—Process for the Hydrogenation of Carbonyl and Carboxyl Groups

Example 5 describes a hydrogenation process for carbonyl and carboxyl groups. The description is simplified as usual; self-evident components that are not relevant to the invention, such as valves, pumps etc. are not shown or described.

In Example 5, the aim is to hydrogenate isononanal (INAL) to isononanol (isononyl alcohol, INA). The capacity of the plant is 50 000 tonnes per year for an availability of the plant of 8000 hours per year. INAL and hydrogen are fed to a reactor (e.g. a bubble-column reactor or a gassed stirred-tank reactor). The conversion of the INAL to INA and by-products and/or consecutive products takes place in the reactor under reaction conditions (temperature 150° C. and pressure 50 bar). Excess hydrogen, as well as gaseous by-products or inert substances leave the reactor and are dissipated as off-gas. The liquid product discharge is passed to a nitrofiltration unit, where the catalyst is separated off. The unit is operated in two stages in order to increase the retention, the required membrane area arises from the permeability of the membranes and is shown in Table 5. Catalyst-depleted permeate can then be fed to further processing steps (for example distillation). The ruthenium mass fraction w(Ru) in the permeate is given in Table 5. Catalyst-rich retentate is returned to the reactor as catalyst circulation. The proportionate production costs were estimated on the basis of the following assumptions: the total ruthenium which leaves the plant via the permeate of the nanofiltration must be purchased later at market prices. Three assumed market prices were included in the calculation and are given in Table 5.

The membranes all have a market price of 1000 euros per square meter and a service life of 2 years, meaning that every year half of the required membrane area has to be replaced. The initial charging forms part of the capital costs and is not taken into consideration in the calculation.

TABLE 5

Ru mass fraction, membrane area and proportionate production costs

| | w(Ru) | Membrane area | Production costs proportion [EUR/t product] | | |
|---|---|---|---|---|---|
| Name | mg/kg | m2 | Ru @ 1 EUR/g | Ru @ 5 EUR/g | Ru @ 20 EUR/g |
| A | 0.34 | 1488.10 | 15.22 | 16.60 | 21.76 |
| B | 0.01 | 3787.88 | 37.89 | 37.93 | 38.07 |
| D | 0.74 | 4275.79 | 43.50 | 46.46 | 57.55 |
| F | 0.07 | 2591.39 | 25.99 | 26.28 | 27.36 |
| G | 0.37 | 1138.19 | 11.75 | 13.22 | 18.72 |
| H | 0.33 | 1354.53 | 13.88 | 15.21 | 20.19 |
| L | 0.34 | 946.97 | 9.81 | 11.18 | 16.32 |
| M | 1.47 | 443.26 | 5.90 | 11.78 | 33.80 |
| N | 0.57 | 661.38 | 7.18 | 9.45 | 17.94 |
| P | 0.44 | 745.82 | 7.90 | 9.67 | 16.29 |

The examples show that a prejudice prevailing in the prior art is disproved by the statements according to the invention. Thus, for example, DE102009047351A1 expressly points out that an adequate separation performance of a membrane can only be assumed if at least 95% of the component to be retained is also actually retained. By contrast, the above examples demonstrate that such a reduced consideration of the complex thematics of organophilic nanofiltration is not just. For example, on account of the described prejudice, the person skilled in the art would select membranes B or C from the currently commercially available membranes (membranes A to D) since only these have a catalyst retention of more than 95%. In a process which has been designed in accordance with these principles, this would lead to a production cost proportion (through metal loss and membrane costs) of 10 to 14 euros per ton of product (under the framework conditions specified in Example 3). In a process developed in accordance with the method according to the invention, he would select membrane A already among the commercially available membranes since although this has a retention below 95%, the MPI is at an advantageous 0.35 at least for low metal prices. In one example process, this membrane would lead only to costs in the order of magnitude of 5 Euros per ton of product. The membranes selected according to the prior art, by contrast, have MPI values significantly below 0.35 and would, justly, not be used in a process developed in accordance with the invention.

Furthermore, the examples show that it is advantageous for a process according to the invention developed in accordance with the procedure according to the invention to use membranes with a separation-active layer made of silicone acrylates (membranes A to P).

Firstly, it becomes clear that by using fewer components a very broad palette of membranes can be produced. By adapting the coating conditions (rolling speed of the substructure and polymer concentration in the immersion bath) and/or by varying the composition of the silicone acrylate mixture, it is possible to adjust the membrane parameters of retention and permeability within a wide field. Thus, in the case of the membranes produced according to the invention, for example, the retention varies from approx. 75% to more than 97% and the permeability from 0.5 kg/(m² h bar) to more than 2.85 kg/(m² h bar). This variability permits the design according to the invention of a process. It becomes clear that virtually all silicone acrylate membranes have an MPI above 0.35, and many even of 0.45 or higher.

The use of such membranes is particularly advantageous, as can be derived from the stated example production cost proportions. During the assessment, it is important to take into consideration that the MPI values in Table 2 should only be compared columnwise (i.e. for the same assumed metal price). Thus, the ideal membrane can be selected for the case under consideration.

Since the framework conditions can change over years of operating a process (in particular the precious metal prices, which constitute a significant proportion of the catalyst costs of a process, are often subject to significant fluctuations that are relevant in the medium- to long-term), a regular reevaluation of a continuing process with the help of the MPI is sensible. Since all polymer membranes are subject to a certain ageing, they have to be replaced at regular intervals. Depending on the substance systems (membrane and substance streams to be separated), service lives of a membrane module from a few months up to several years may be possible. In practice, service lives from 6 to 24 months are not uncommon. The advantage of continuing evaluation by means of the MPI in conjunction with the use of the flexible silicone acrylate technology platform now makes it possible to undertake an evaluation before each replacement of the membrane module and to select the optimal membrane material at the particular time for the reequipping. Since large effects can be attained with slight adjustments in the production of the membrane material, silicone acrylate membranes are particularly readily suitable for a process control of this type.

Even in the case of the membranes E to P, it is evident that an evaluation alone on the basis of the retention is not suitable because the membranes with the highest retention do not always also have the best (highest) MPI. However, it is immediately evident from Table 3 that the membranes with a lower MPI generally lead to higher production costs.

What is claimed is:

1. A method for separating a homogeneous catalyst or degradation products thereof from a reaction mixture with organophilic nanofiltration, the method comprising the steps of:
    A) hydroformylating an alkene in the presence of the homogeneous catalyst comprising an organometallic complex compound comprising a central metal atom selected from the group consisting of cobalt, rhodium, iridium, ruthenium, and palladium in a reactor, generating a reaction mixture comprising a liquid hydroformylation discharge comprising aldehyde, unreacted alkene synthesis gas being dissolved in the liquid;
    B) drawing the reaction mixture off the reactor;
    C) partially decompressing the reaction mixture in a degasser;
    D) placing the degassed reaction mixture into a nanofiltration membrane separation unit comprising the membrane, which is carried out under carbon monoxide partial vapor pressure in order to prevent the catalyst from losing its activity, wherein the reaction mixture further comprises a liquid organic solvent and the homogeneous catalyst or constituents or degradation products of the homogeneous catalyst, wherein the membrane comprises a separation-active layer made of silicone acrylate;
    E) separating the reaction mixture on the membrane into a retentate and a permeate, wherein the homogeneous catalyst or its constituents or degradation products is enriched in the retentate, wherein the concentration of the homogeneous catalyst or of its constituents or degradation products in the retentate is greater than in the permeate; and
    F) removing the dissolved synthesis gas from the permeate.

2. The method of claim 1, wherein the central atom is selected from the group consisting of cobalt and rhodium.

3. A hydroformylation system for reacting a mixture by a a hydroformylation reaction of an alkene utilizing an homogenous catalyst comprising an organometallic complex compound comprising a central metal atom selected from the group consisting of cobalt rhodium, iridium, ruthenium, and palladium in the presence of a liquid solvent, and the system comprising:
    a hydroformylation reactor generating a reaction mixture which forms a liquid hydroformylation discharge comprising aldehyde, unreacted alkene, and synthesis gas dissolved in the liquid solvent;
    a first degasser device configured to partially decompress the reaction mixture;
    a separator for separating off homogeneous catalyst or degradation products thereof from the partially decompressed reaction mixture by way of organophilic nanofiltration, wherein the separator comprises a membrane which has an inlet for a feed, an outlet for a retentate and an outlet for a permeate,
    wherein the membrane comprises a separation-active layer made of silicone acrylate; and
    a second degasser device to remove the dissolved synthesis gas from the permeate.

4. The device of claim 3, wherein the central atom is selected from the group consisting of cobalt and rhodium.

5. The device of claim 3, where the the central atom is rhodium.

* * * * *